(12) United States Patent
Steigert

(10) Patent No.: US 12,719,511 B2
(45) Date of Patent: Aug. 25, 2026

(54) CURRENT MONITORING FOR TIME DIVISION DUPLEX POWER AMPLIFIER IN A COMMUNICATION SYSTEM

(71) Applicant: Outdoor Wireless Networks LLC, Claremont, NC (US)

(72) Inventor: Johannes Steigert, Harburg (DE)

(73) Assignee: Outdoor Wireless Networks LLC, Richardson, TX (US)

( * ) Notice: Subject to any disclaimer, the term of this patent is extended or adjusted under 35 U.S.C. 154(b) by 246 days.

(21) Appl. No.: 18/753,149

(22) Filed: Jun. 25, 2024

(65) Prior Publication Data

US 2025/0007539 A1 Jan. 2, 2025

Related U.S. Application Data

(60) Provisional application No. 63/510,576, filed on Jun. 27, 2023.

(51) Int. Cl.
*H04B 1/00* (2006.01)
*H03F 3/193* (2006.01)

(52) U.S. Cl.
CPC ........... *H04B 1/0078* (2013.01); *H03F 3/193* (2013.01); *H04B 1/0007* (2013.01); *H03F 2200/451* (2013.01)

(58) Field of Classification Search
CPC ............... H03F 2200/451; H03F 3/245; H03F 2200/102; H03F 3/19; H03F 1/0227; H03F 3/195; H03F 1/0266; H03F 2200/105; H03F 1/56; H03F 1/0238; H03F 2200/294; H03F 2200/318; H03F 2200/387; H03F 1/0211; H03F 1/0261; H03F 2200/171; H03F 3/21; H03F 3/45076; H03F 1/0222; H03F 1/025; H03F 1/30; H03F 2200/129; H03F 2200/165; H03F 2200/204; H03F 2200/207; H03F 2200/21; H03F 3/193; H03F 3/45475; H03F 2200/18; H03F 2200/441; H03F 2200/555; H03F 2201/3227;

(Continued)

(56) References Cited

U.S. PATENT DOCUMENTS 5,426,641 A * 6/1995 Afrashteh .............. H03G 3/007
370/347
7,660,564 B2 * 2/2010 Lee ........................ H04B 1/525
330/296

(Continued)

*Primary Examiner* — Golam Sorowar
(74) *Attorney, Agent, or Firm* — Fogg & Powers LLC

(57) ABSTRACT

A current monitoring circuit for a TDD power amplifier in a communication system is provided. The current monitoring circuit includes a voltage measurement circuit and a stabilizer circuit. The voltage measurement circuit is configured to generate current equivalent voltage output signals associated with the TDD power amplifier. The stabilizer circuit has an output that is coupled to an analog-to-digital converter. The stabilizer circuit includes a switch, a first resistor, a capacitor and a first voltage supply. The switch includes a first post that is coupled to an output of the voltage measurement circuit. The first resistor has a first side coupled to a second post of the switch. The capacitor coupled in series with the first resistor. The capacitor is further coupled to ground. The first voltage supply is coupled to control the switch based on operations of a TDD power amplifier.

20 Claims, 7 Drawing Sheets

(58) Field of Classification Search
CPC . H03F 3/189; H03F 3/191; H03F 3/24; H03F 3/72; H03F 1/0205; H04B 1/40; H04B 1/04; H04B 2001/0408; H04B 2001/045; H04B 1/0475; H04B 1/3827; H04B 17/12; H04B 1/0078; H04B 1/0458; H04B 1/1027; H04B 1/18; H04B 1/3838; H04B 17/11; H04B 17/13; H04B 17/14; H04B 17/22; H04B 17/327; H04B 17/364; H04B 2001/0425; H04B 2001/0433; H04B 2001/1063; H04B 1/0064; H04B 1/0483; H04B 1/1615; H04B 1/406; H04B 1/48; H04B 2001/0416; H04B 1/0053
See application file for complete search history.

(56) References Cited

U.S. PATENT DOCUMENTS

| | | | | |
|---|---|---|---|---|
| 9,647,623 | B2 * | 5/2017 | Coban | H03G 3/3068 |
| 9,998,138 | B1 * | 6/2018 | Wang | H03M 1/1215 |
| 10,871,524 | B2 * | 12/2020 | Gross | G01R 31/40 |
| 11,032,054 | B2 | 6/2021 | Steigert et al. | |
| 2020/0228064 | A1 * | 7/2020 | Datta | H03F 1/0211 |
| 2025/0373215 | A1 * | 12/2025 | Pehlke | H03F 3/245 |
| 2026/0074720 | A1 * | 3/2026 | Wang | H04B 1/04 |

* cited by examiner

CURRENT MONITORING FOR TIME DIVISION DUPLEX POWER AMPLIFIER IN A COMMUNICATION SYSTEM

CROSS-REFERENCE TO RELATED APPLICATIONS

This Application claims priority to U.S. Provisional Application Ser. No. 63/510,576, same title herewith, filed on Jun. 27, 2023, which is incorporated in its entirety herein by reference.

BACKGROUND

It is common for communication systems to use power amplifiers to amplify communication signals that are communicated between components of the system. One type of communication system that uses power amplifiers is a wireless cellular communication system. Power amplifiers may be used when processing and communicating signals between components.

Wireless cellular service providers use base stations to implement wireless communication links with user equipment, such as mobile phones. In particular, a base station is typically in communication with one or more antennas that receive and transmit radio frequency signals to and from user equipment. Each base station in turn is in communication with a core network of the service provider.

In a typical time division duplex (TDD) power amplifier, one or more RF transistor stages in the RF lineup are switched off via the corresponding gate voltages or the power supply if the related communication system is in receive mode (i.e., the base station (such as a gNB) expects signal reception from a user equipment (UE)). By doing so, the power amplifier alternates between theoretically zero power consumption and current draw (while the system is in receive (Rx) mode) and maximum power consumption and current draw (while the system is in transmit (Tx) mode).

In order to track performance, stability, and compensation of a power amplifier at a circuit level, a drain current of a radio frequency (RF) transistor is a key parameter which has to be measured very accurately during calibration and operation. In typical base station applications, voltage drop via a sense resistor in the DC current supply line of the power amplifier is analog-to-digital converted. The digitally converted shunt resistor voltage drop of the power amplifier is polled by a field programable gate array (FPGA) or microcontroller using a digital bus and converted into a current reading. Typically, the digital bus in such systems is used for a lot of functionalities besides current measurement. As a result, data polling can be quite slow which can lead to problems in modern cellular communication systems. Current cellular communication systems include long term evolution (LTE) and 5G new radio (NR) technologies that require real-time operation with short uplink (UL)/downlink (DL) frame durations. With data polling being slow in TDD amplifiers systems using digital buses, time of measurement cannot be predicted in practice nor properly synchronized with the TDD receive/transmit switch points.

For the reasons stated above and for other reasons stated below which will become apparent to those skilled in the art upon reading and understanding the present specification, there is a need in the art for a system to monitors accurate current measurements in non-time synchronized digital buses in TDD power amplifier applications.

SUMMARY

The following summary is made by way of example and not by way of limitation. It is merely provided to aid the reader in understanding some of the aspects of the subject matter described. Embodiments provide a circuit that monitors accurate current measurements in non-time synchronized digital buses in TDD power amplifier applications.

In one embodiment, a current monitoring circuit for a TDD power amplifier in a communication system is provided. The current monitoring circuit includes a voltage measurement circuit and a stabilizer circuit. The voltage measurement circuit is configured to generate current equivalent voltage output signals associated with the TDD power amplifier. The stabilizer circuit has an output that is coupled to an analog-to-digital converter. The stabilizer circuit includes a switch, a first resistor, a capacitor and a first voltage supply. The switch includes a first post that is coupled to an output of the voltage measurement circuit. The first resistor has a first side coupled to a second post of the switch. The capacitor coupled in series with the first resistor. The capacitor is further coupled to ground. The first voltage supply is coupled to control the switch based on operations of a TDD power amplifier.

In another embodiment, another current monitoring circuit for a TDD power amplifier in a communication system is provided. The current monitoring circuit includes a voltage measurement circuit and a stabilizer circuit. The stabilizer circuit includes a switch, a first resistor, a capacitor, a first voltage supply, a second resistor, a third resistor, a second operational amplifier, and a third operational amplifier. The voltage measurement circuit is configured to generate current equivalent voltage output signals. The switch of the stabilizer circuit includes a first post that is coupled to an output of the voltage measurement circuit. The first resistor has a first side that is coupled to a second post of the switch. The capacitor is coupled in series with the first resistor. The capacitor is further coupled to ground. The first voltage supply is coupled to control the switch synchronized with the first voltage supply by a TDD switching signal used to switch RF transistors in the TDD power amplifier. The second resistor has a first side that is coupled to the second post of the switch and a second side that is coupled to the ground. The third resistor has a first side that is coupled to the second post of the switch. The second operational amplifier has a first input that is coupled to receive the current equivalent voltage signals output from the voltage measurement circuit. The second operational amplifier has a second input that is coupled to the output of the second operational amplifier. The output of the second operational amplifier is coupled to the first post of the switch. The third operational amplifier has a first input that is coupled to a second side of the third resistor. The third operational amplifier has a second input that is coupled to an output of the third operation amplifier. The output of the third operational amplifier coupled to an ADC.

In yet another embodiment, a method of operating a communication system is provided. The method includes generating TDD switching signals having transmit time frames and receive time frames; controlling RF transistors in a TDD power amplifier based on the TDD switching signals, wherein the TDD switching signals selectively turn on and off the RF transistors based on the transmit time frames and receive time frames; generating current equivalent voltage output signals from a voltage drop of a sense resistor in a direct current (DC) supply line coupled to the TDD power amplifier with a voltage measurement circuit; stabilizing the equivalent voltage output signal by selectively applying a stabilizer circuit that includes a capacitor in series with a resistor during a transmit frame in the TDD switching signals and disconnecting the stabilizer circuit during a receive frame of the TDD switching signals; converting the equivalent voltage output signal to a digital signal equivalent voltage output signal; reading the digital signal current equivalent voltage output signal off of a bus; and determining a current of the TDD power amplifier from the digital signal current equivalent voltage read off of the bus.

BRIEF DESCRIPTION OF THE DRAWINGS

The present invention can be more easily understood and further advantages and uses thereof will be more readily apparent, when considered in view of the detailed description and the following figures in which.

In accordance with common practice, the various described features are not drawn to scale but are drawn to emphasize specific features relevant to the present invention. Reference characters denote like elements throughout Figures and text.

DETAILED DESCRIPTION

In the following detailed description, reference is made to the accompanying drawings, which form a part hereof, and in which is shown by way of illustration specific embodiments in which the inventions may be practiced. These embodiments are described in sufficient detail to enable those skilled in the art to practice the invention, and it is to be understood that other embodiments may be utilized and that changes may be made without departing from the spirit and scope of the present invention. The following detailed description is, therefore, not to be taken in a limiting sense, and the scope of the present invention is defined only by the claims and equivalents thereof.

Embodiments of the present invention provide a circuit that monitors accurate current measurements in non-time synchronized digital buses in a TDD power amplifier application. The term "coupled," as used herein, generally means that one component is in operational communication with another component either directly or indirectly through intermediate components or circuits.

Figure 1:
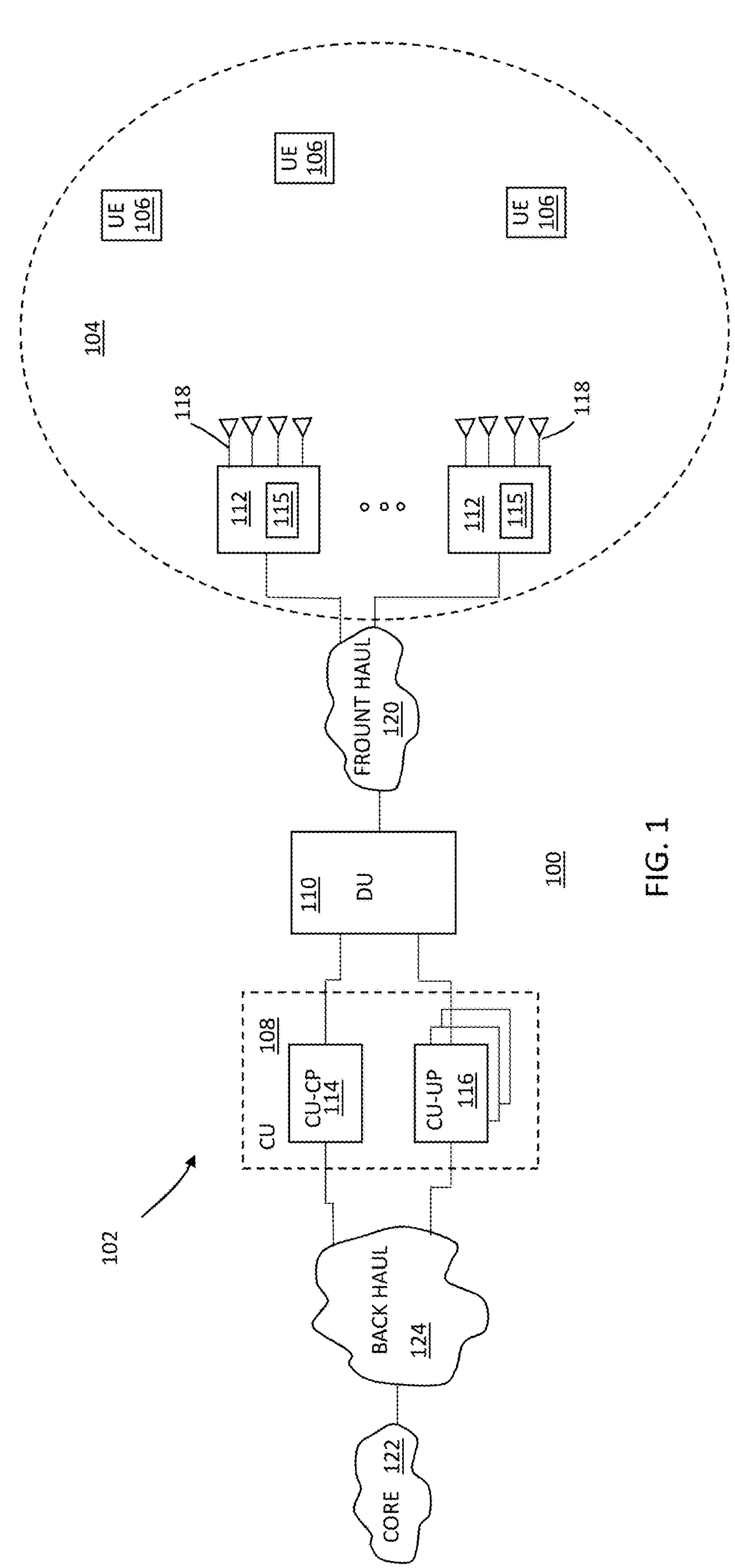
FIG. 1 illustrates a block diagram of a radio access network (RAN) communication system having a current monitoring circuit for a TDD power amplifier according to an example aspect of the preset invention.

FIG. 1 is a block diagram illustrating one exemplary embodiment of a radio access network (RAN) communication system 100 in which an enhanced power amplifier current monitoring circuit in TDD applications may be implemented. The RAN system 100 shown in FIG. 1 implements at least one base station entity 102 to serve a cell 104. Each such base station entity 102 can also be referred to here as a "base station" or "base station system" (and, which in the context of a fourth generation (4G) Long Term Evolution (LTE) system, may also be referred to as an "evolved NodeB", "eNodeB", or "eNB" and, in the context of a fifth generation (5G) New Radio (NR) system, may also be referred to as a "gNodeB" or "gNB").

In general, each base station 102 is configured to provide wireless service to various items of user equipment (UEs) 106 served by the associated cell 104. Unless explicitly stated to the contrary, references to Layer 1, Layer 2, Layer 3, and other or equivalent layers (such as the Physical Layer or the Media Access Control (MAC) Layer) refer to layers of the particular wireless interface (for example, 4G LTE or 5G NR) used for wirelessly communicating with UEs 106. Furthermore, it is also to be understood that 5G NR embodiments can be used in both standalone and non-standalone modes (or other modes developed in the future) and the following description is not intended to be limited to any particular mode. Moreover, although some embodiments are described here as being implemented for use with 5G NR, other embodiments can be implemented for use with other wireless interfaces and the following description is not intended to be limited to any particular wireless interface.

In the specific exemplary embodiment shown in FIG. 1, each base station 102 is implemented as a respective 5G NR base station 102 (only one of which is shown in FIG. 1 for ease of illustration). In this embodiment, each base station 102 is partitioned into one or more central unit entities (CUs) 108, one or more distributed unit entities (DUs) 110, and one or more radio units (RUs) 112. In such a configuration, each CU 108 implements Layer 3 and non-time critical Layer 2 functions for base station 102. In the embodiment shown in FIG. 1, each CU 108 is further partitioned into one or more control-plane entities 114 and one or more user-plane entities 116 that handle the control-plane and user-plane processing of the CU 108, respectively. Each such control-plane CU entity 114 is also referred to as a "CU-CP" 114, and each such user-plane CU entity 116 is also referred to as a "CU-UP" 116. Also, in such a configuration, each DU 110 is configured to implement the time critical Layer 2 functions and, except as described below, at least some of the Layer 1 functions for the base station 102. In this example, each RU 112 is configured to implement the physical layer functions for the base station 102 that are not implemented in the DU 110 as well as the RF interface. Also, each RU 112 includes a respective set of one or more antenna ports 118 via which the RU 112 can be coupled to a set of antennas (not shown) via which DL analog RF signals can be radiated to UEs 106 and via which UL analog RF signals transmitted by UEs 106 can be received.

Each RU 112 is communicatively coupled to the DU 110 serving it via a fronthaul network 120. The fronthaul network 120 can be implemented using a switched Ethernet network, in which case each RU 112 and each physical node on which each DU 110 is implemented includes one or more Ethernet network interfaces to couple each RU 112 and each DU physical node to the fronthaul network 120 in order to facilitate communications between the DU 110 and the RUs 112. In one implementation, the fronthaul interface promulgated by the O-RAN Alliance is used for communication between the DU 110 and the RUs 112 over the fronthaul network 120. In another implementation, a proprietary fronthaul interface that uses a so-called "functional split 7-2" for at least some of the physical channels (for example, for the PDSCH and PUSCH) and a different functional split for at last some of the other physical channels (for example, using a functional split 6 for the PRACH and SRS).

In such an example, each CU 108 is configured to communicate with a core network 122 of the associated wireless operator using an appropriate backhaul network 124 (typically, a public wide area network such as the Internet).

Although FIG. 1 (and the description set forth below more generally) is described in the context of a 5G embodiment in which each logical base station entity 102 is partitioned into a CU 108, DUs 110, and RUs 112 and, for at least some of the physical channels, some physical-layer processing is performed in the DUs 110 with the remaining physical-layer processing being performed in the RUs 112, it is to be understood that the techniques described here can be used with other wireless interfaces (for example, 4G LTE) and with other ways of implementing a base station entity (for example, using a conventional baseband band unit (BBU)/remote radio head (RRH) architecture). Accordingly, references to a CU, DU, or RU in this description and associated figures can also be considered to refer more generally to any entity (including, for example, any "base station" or "RAN" entity) implementing any of the functions or features described here as being implemented by a CU, DU, or RU.

Each CU 108, DU 110, and RU 112, and any of the specific features described here as being implemented thereby, can be implemented in hardware, software, or combinations of hardware and software, and the various implementations (whether hardware, software, or combinations of hardware and software) can also be referred to generally as "circuitry," a "circuit," or "circuits" that is or are configured to implement at least some of the associated functionality. When implemented in software, such software can be implemented in software or firmware executing on one or more suitable programmable processors (or other programmable device) or configuring a programmable device (for example, processors or devices included in or used to implement special-purpose hardware, general-purpose hardware, and/or a virtual platform). In such a software example, the software can comprise program instructions that are stored (or otherwise embodied) on or in an appropriate non-transitory storage medium or media (such as flash or other non-volatile memory, magnetic disc drives, and/or optical disc drives) from which at least a portion of the program instructions are read by the programmable processor or device for execution thereby (and/or for otherwise configuring such processor or device) in order for the processor or device to perform one or more functions described here as being implemented the software. Such hardware or software (or portions thereof) can be implemented in other ways (for example, in an application specific integrated circuit (ASIC), etc.).

Moreover, each CU 108, DU 110, and RU 112, can be implemented as a physical network function (PNF) (for example, using dedicated physical programmable devices and other circuitry) and/or a virtual network function (VNF) (for example, using one or more general purpose servers (possibly with hardware acceleration) in a scalable cloud environment and in different locations within an operator's network (for example, in the operator's "edge cloud" or "central cloud"). Each VNF can be implemented using hardware virtualization, operating system virtualization (also referred to as containerization), and application virtualization as well as various combinations of two or more the preceding. Where containerization is used to implement a VNF, it may also be referred to as a "containerized network function" (CNF).

For example, in the exemplary embodiment shown in FIG. 1, each RU 112 is implemented as a PNF and is deployed in or near a physical location where radio coverage is to be provided and each CU 108 and DU 110 is implemented using a respective set of one or more VNFs deployed in a distributed manner within one or more clouds (for example, within an "edge" cloud or "central" cloud).

Each CU 108, DU 110, and RU 112, and any of the specific features described here as being implemented thereby, can be implemented in other ways.

Figure 2:
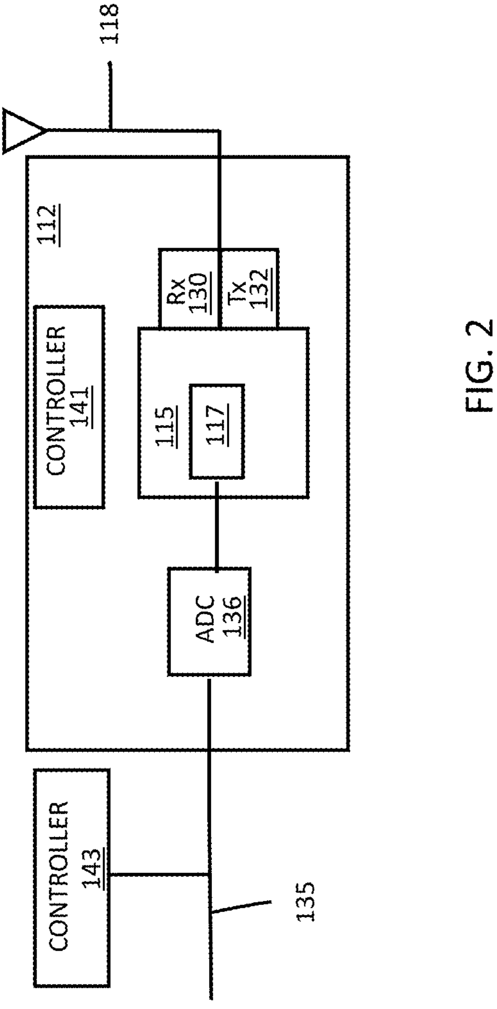
FIG. 2 illustrates a remote unit of the RAN communication system having a current monitoring circuit for a TDD power amplifier of FIG. 1.

The remote units 112 of the base station 102 in this example includes a TDD power amplifier 115 with enhance current monitoring. FIG. 2 illustrates a block diagram of a remote unit 112 that includes a TDD power amplifier 115 with enhanced current monitoring. This example of a remote unit 112, includes a receiver (Rx) 130 to receive RF communication signals from UEs 106 and a transmitter (Tx) 132 to transmit RF communications signals to the UEs 106 through antenna port 118. The RU 112 includes a unit controller 141 used to control the receive and transmit functions of receiver 130 and transmitter 132 based on transmit time frames and receive time frames in TDD switching signals.

The TDD amplifier 115 includes a TDD voltage measurement circuit 117. The TDD voltage measurement circuit 117 is in communication with an analog-to-digital converter (ADC) 136. An output of the ADC is in communication with a bus 135. A controller 143, that provides current monitoring for TDD applications in the communication system, is in communication with the bus 135. The controller 143 may be part of a unit controller 141 or it may be part of another component of the base station entity 102 including the CU 108, the DU 110 and in the front haul 120.

Figure 3:
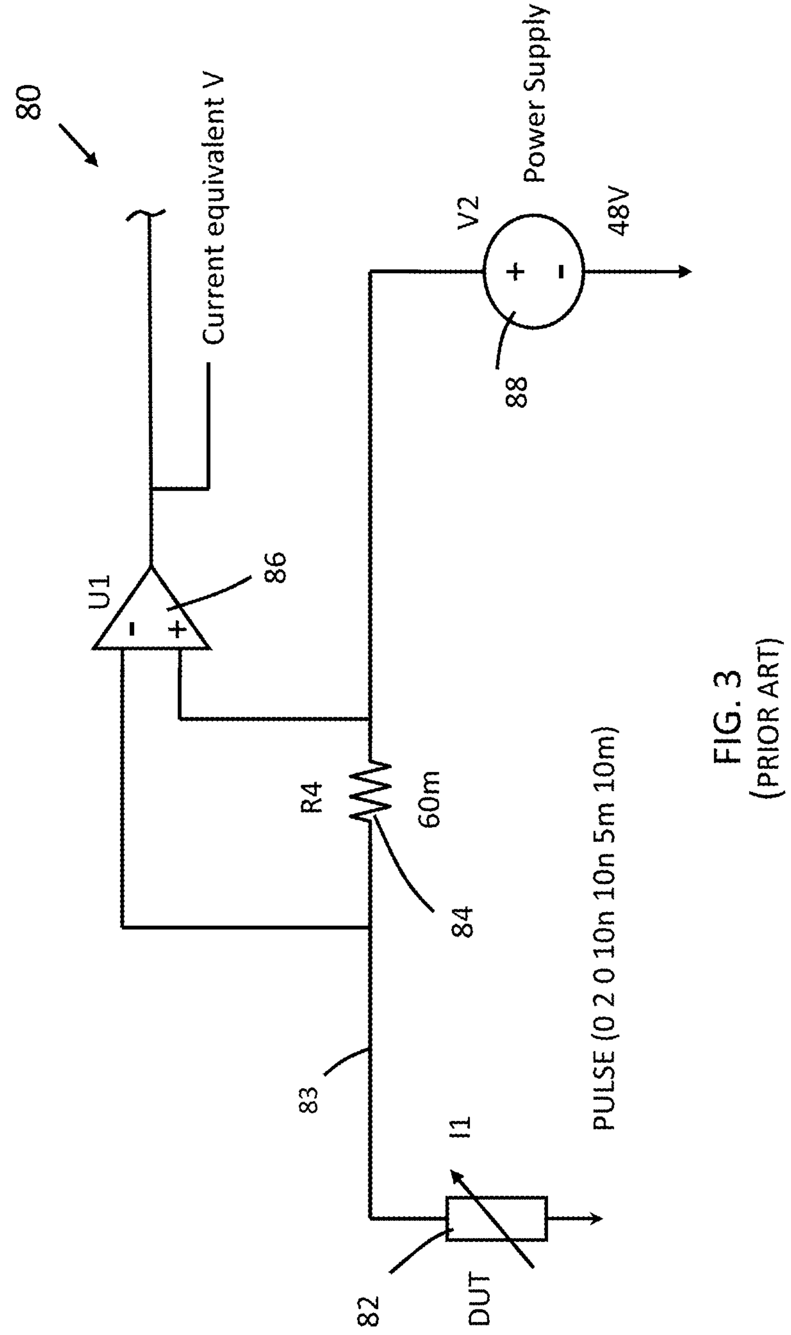
FIG. 3 illustrates a voltage measurement system of the prior art.

For further background, a state-of-the-art (prior art) voltage measurement circuit 80 is illustrated in the schematic diagram of FIG. 3. In this prior art voltage measurement circuit 80, a low ohmic shunt resistor 84 (R4) (a fourth or sense resistor) is positioned between a voltage supply 82 (V2) and dynamically changing (or in some cases static) load current, (i.e., from a device under test (DUT) 82 (I1) such as a power amplifier. A voltage drop across the low ohmic sense resistor 84 is fed to an operational amplifier 86 (U1) which outputs a single voltage which is directly proportional to the current flow through the sense resistor 84 into the DUT 82. Hence, the voltage measurement circuit 80 generates current equivalent voltage output signals from the voltage drop across sense resistor 84 that is in a direct current (DC) supply line 83 that is coupled to the DUT 82. The output voltage of the voltage measurement circuit 80 is analog-to-digital converted and then polled by a controller, such as controller 143 discussed above which may be a field programable gate array (FPGA) or microcontroller using a digital bus like an inter-integrated circuit (IIC) bus or a serial peripheral interface (SPI) bus. The controller converts the voltage into a current reading. As discussed above, the digital bus is not used exclusively for the current measurement but for a lot of functionalities in the communication system (e.g., general-purpose input/output (GPIOs)) the data polling rate can be quite slow and not suitable for real-time operation with short UL/DL frame durations of minimum 1 ms which are used with LTE and 5GNR. Furthermore, the problem is amplified as the time of measurement cannot be predicted in practice nor properly synchronized with the TDD Rx/Tx switch points.

Figure 4:
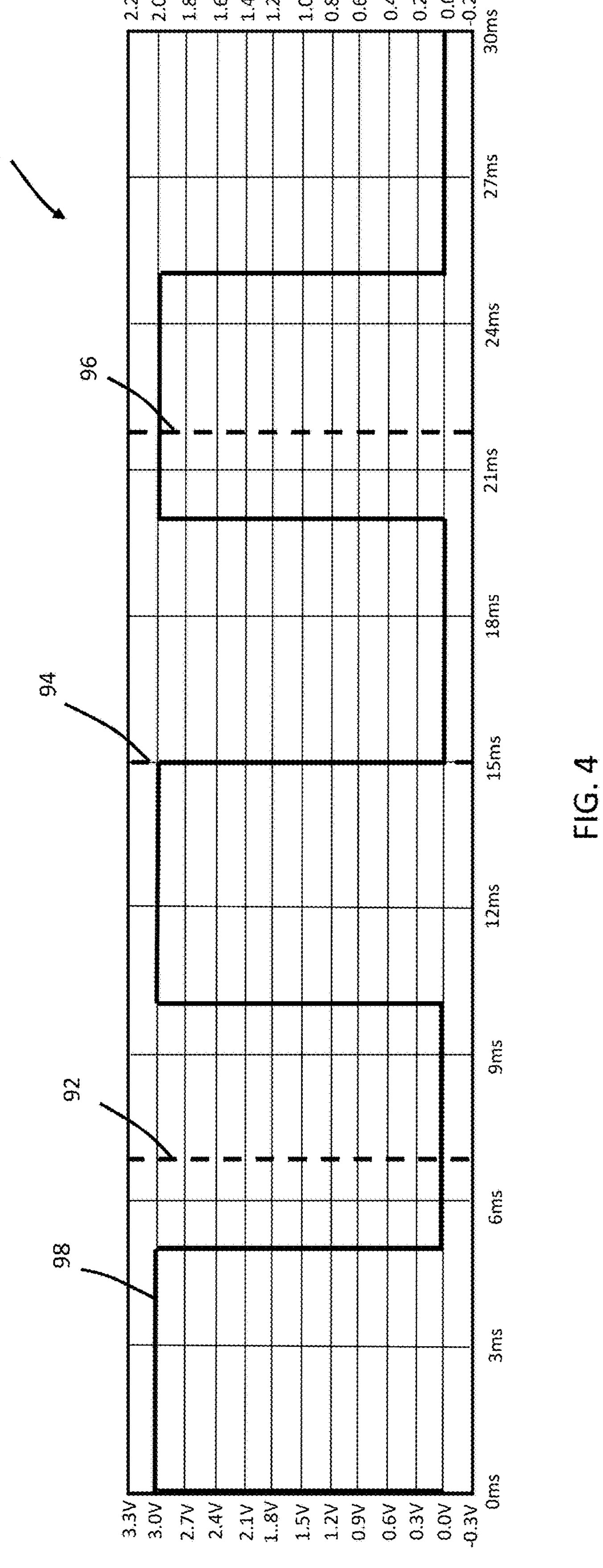
FIG. 4 illustrates a voltage-equivalent output voltage verse time graph for the prior art voltage measurement system of FIG. 3.

FIG. 4 illustrates a DUT voltage-equivalent output voltage verses time graph 90 associated with the prior art voltage measurement circuit 80 described above in view of prior art FIG. 3. The output voltage of operational amplifier 86 is directly proportional to the current flow through shunt resistor 84. Graph 90 further illustrates that current is measured at random time points 92, 94 and 96. Since the current measurements are collected at random time points, a measurement reading cannot be identified to be within either a receive or transmit time frame or a transitionary state. Hence, the accuracy of the measurement technique heavily suffers from TDD switching of DUT 82, (i.e., a power amplifier especially in case of short transmit periods) with the prior art current measurement circuit 80.

Figure 5:
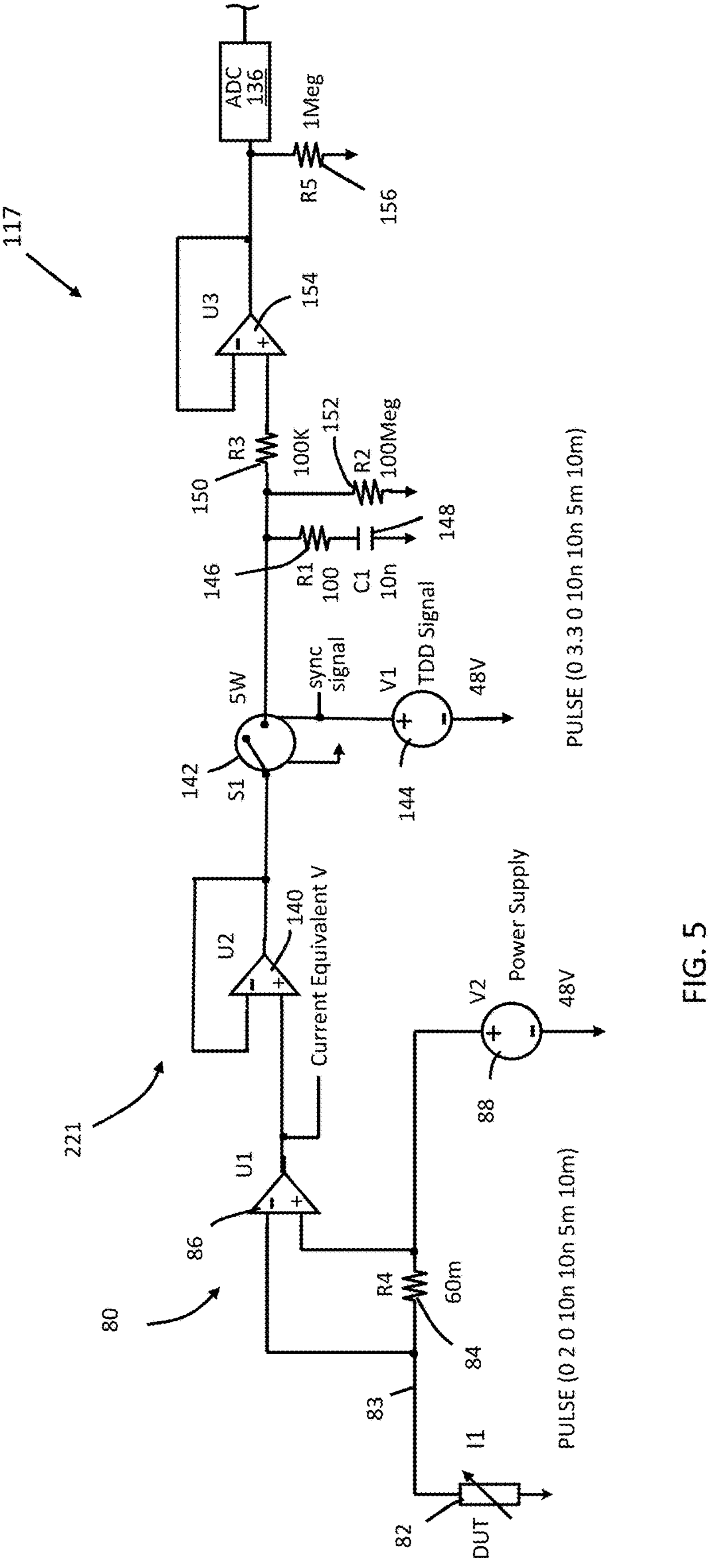
FIG. 5 illustrates TDD voltage measurement circuit according to an example aspect of the preset invention.

FIG. 5 illustrates a TDD voltage measurement circuit 117 of one example embodiment. The TDD voltage measurement circuit 117 overcomes the issue of in-accurate current measurements when non-time synchronized digital buses (II2, SPI) are used to collect current readings from an analog-to-digital converter in TDD power amplifier applications. The TDD voltage measurement circuit 117 includes the voltage measurement circuit 80 discussed above and a stabilization circuit 221 that includes, in one example, two additional operation amplifiers 140 and 154, an analog switch 142, discrete resistors 146, 152, 150, and capacitor 148 as illustrated in FIG. 5.

As discussed above, in the voltage measurement circuit 80, a first side of shunt resistor 84 (R4) is coupled to DUT 82 (I1) (which would be TDD power amplifier 115 of FIG. 2) and a second voltage supply 88 (V2) is coupled to a second side of shunt resistor 84 R4. The first operational amplifier 86 (U1) has a first input coupled to the first side of resistor 84 and a second input coupled to the second side the resistor 84.

An output of the first operational amplifier 86 of the current measurement circuit 80 is coupled to a first input of a second operational amplifier 140 (U2) of the stabilization circuit 221. An output of the second operational amplifier 140 is coupled to a second input to the second operational amplifier 140. The output of the second operational amplifier 140 is further coupled to a first post of analog switch 142 (S1). A second post of analog switch 142 is coupled to a first voltage supply 144 (V1), a first side of a first resistor 146 (R1), a first side of a second resistor 152 (R2) and a first side of a third resistor 150 (R3). The first voltage supply 144 provides a TDD switching signal for the power amplifier 115. A second side of first resistor 146 is coupled to a first plate of capacitor 148 (C1). A second plate of capacitor 148 is coupled to ground.

A second side of the third resistor 150 is coupled to a first input of a third operational amplifier 154 (U3). A second input to operational amplifier 154 is coupled to an output of operational amplifier 154. The output of operational amplifier 154 is also coupled to a first side of a fifth resistor 156 (R5). A second side of the fifth resistor is coupled to ground. Further the output of operational amplifier 154 is coupled to the ADC 136, which in turn is in communication with the shared bus 135 as discussed above. After the output of operational amplifier 154 is analog-to-digital converted, the output is polled by controller 141 using a digital bus 135 like an inter-integrated circuit (IIC) bus or a serial peripheral interface (SPI) bus and converted into a current reading.

Switch 142 is synchronized by a TDD switching signal used to switch RF transistors in the TDD power amplifier 115 through controllable first voltage supply 144. Operational amplifiers 140 and 154 decouple the capacitor 148 and resistors 146, 152 and 150 from the voltage sensor circuit 80 and the ADC 136 to avoid any unwanted charging effects. During a Tx period, switch 142 (S1) is closed and the actual output voltage of operational amplifier 86 U1 (which is proportional to the actual current) charges capacitor 148 (C1) via first resistor 146 R1. During the receive time frame, switch 142 (S1) is open and capacitor 148 (C1) slowly discharges via resistors 146 (R2), 150 (R3) and the parasitic resistances of operational amplifier 154 (U3) and capacitor 148 (C1) itself.

As the discharge time constant of capacitor 148 is much slower than the TDD switching signal, the output (current equivalent) voltage of the enhanced TDD voltage measurement circuit 117 at the output of the operational amplifier 86 remains stable during the receive time frame. This behavior tolerates that the current reading is collected at random points in time. The collected data (current equivalent voltage) represents the current reading which has been captured during the Tx time frame.

Figure 6:
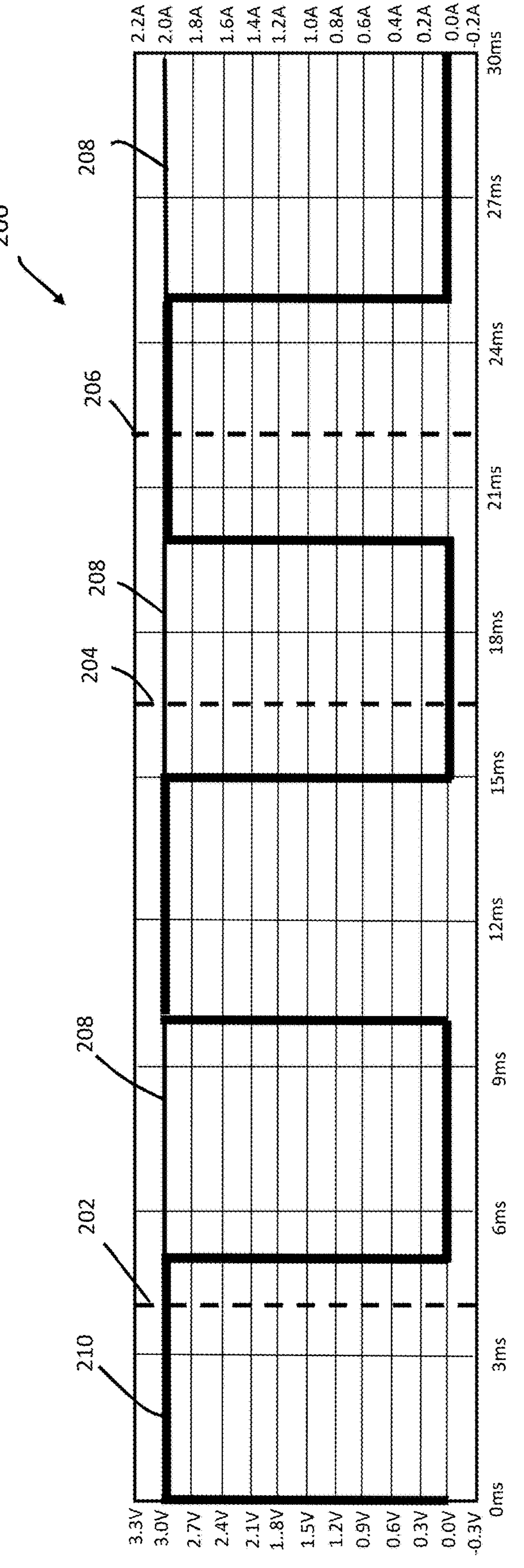
FIG. 6 illustrates a voltage-equivalent output voltage verse time graph for the voltage measurement system of FIG. 5.

FIG. 6 illustrates a corresponding DUT voltage-equivalent output voltage verses time graph 200 associated with the TDD voltage measurement circuit 117 of FIG. 5. Current flowing into the DUT 82 is indicated by 210. The output voltage of the TDD voltage measurement circuit 117 that is fed into the ADC 136 is indicated by 208 and a first measurement time is indicated by 202, a second measurement time is indicated by 204 and the third measurement time is indicated by 206.

The TDD voltage measurement circuit 117 of FIG. 5 can also be used as an analog filter in an example. In the case that the PA is no longer switched, or the PA is used in static Tx (FDD) mode. In this special use case the values of R1, R2, R3 and C1 should be properly chosen in order to represent a desired filtering characteristics for the current reading. Choosing a relatively small time constant, highly dynamic changes can be covered if the digital bus supports a sufficiently high sample rate. In other cases, the time constant is may select a large enough so that the output of the enhanced current measurement circuit does represent a time averaged reading.

Further in another embodiment, instead of using discrete operational amplifiers, the operational amplifiers 140 (U2) and 154 (U3) are integrated sample and hold amplifier. Although sample and hold amplifiers may support much higher sample rates, they often support slower TDD rates and hence could be used as described in an enhanced current measurement circuit. In contrast to fully integrated sample and hold amplifiers, which typically include capacitor 148 (C1) and resistor 146 (R1), the topology described above if view of FIG. 5, using the additional resistors 152 (R2) and 150 (R3), allows a much more sensitive adaption of the charging constant and hence adjustment of dynamic performance.

Figure 7:
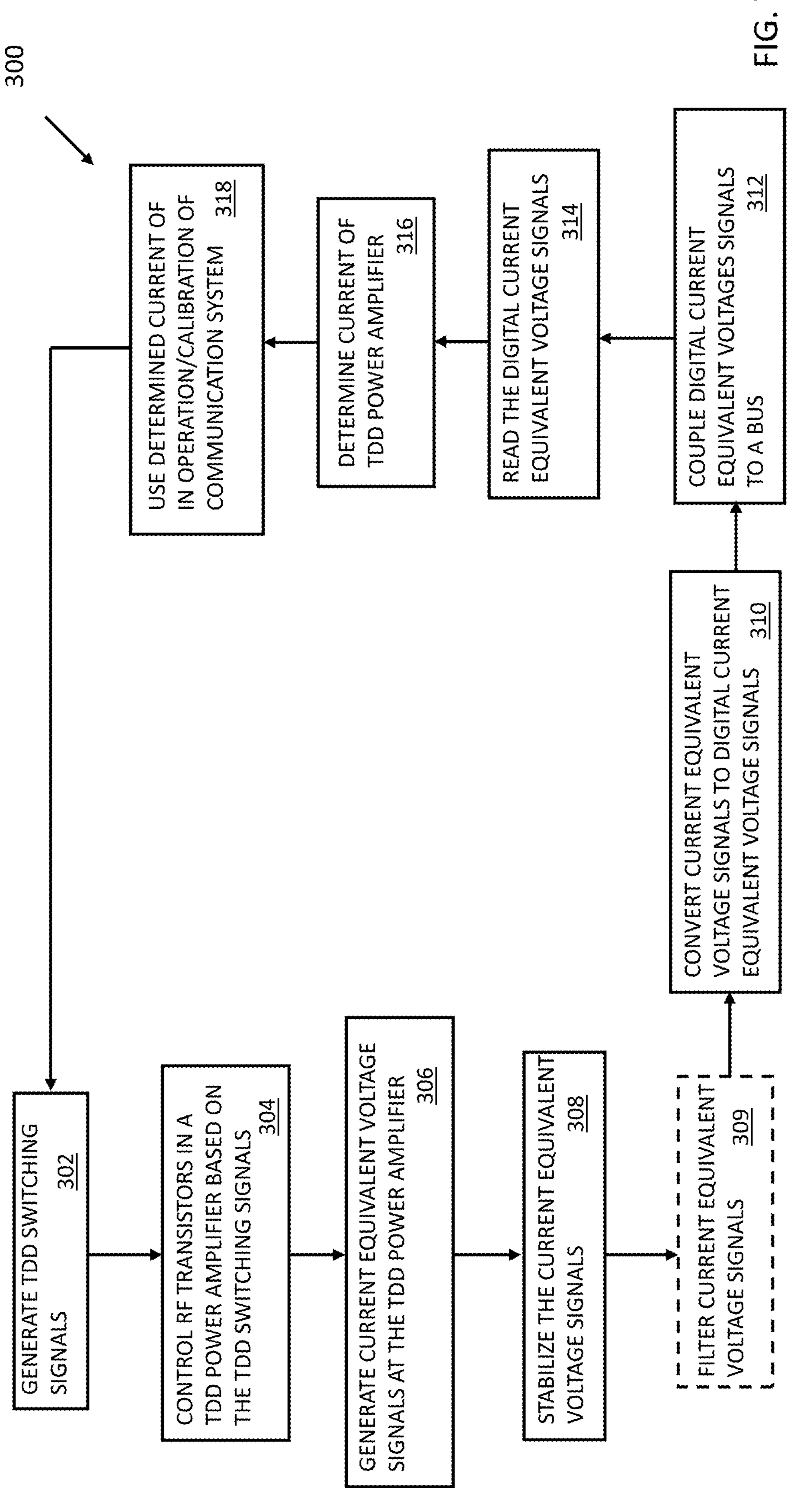
FIG. 7 illustrates a flow diagram of a method of determining a current of a TDD power amplifier according to an example aspect of the preset invention.

FIG. 7 illustrates a flow diagram 300 of a method of determining a current of a TDD power amplifier in one example. Flow diagram 300 is provided in a series of sequential blocks. The sequence of blocks may occur in a different order or in parallel in other embodiments. Hence, embodiments are not limited to the sequence of blocks set out in flow diagram 300 of FIG. 7.

At block 302, TDD switching signals are generated. The TDD switching signals are used to set when the transmitter 132 is to be in transmit mode and when the receiver 130 is in receive mode. The TDD switching signals may include transmit time frames and receive time frames. The TDD power amplifier 115 is powered up when the transmitter 132 is transmitting during transmit time frames and is shut down during receive time frames.

Operations of the TDD power amplifier 115 are controlled by RF transistors in the TDD power amplifier 115. The RF transistors are controlled at block 304 by the TDD switching signals. The TDD power amplifier 115 is powered down during receive time frames by controlling the gate voltage of the RF transistors of the TDD power amplifier 115.

Current equivalent voltages at the TDD power amplifier 115 are determined at block 306. In one example, this is done with a voltage measurement circuit 80 that generates current equivalent voltage output signals from a voltage drop of a sense resistor 84 that is in the DC supply line 83 that is coupled to the TDD power amplifier 115. In examples, the current equivalent voltage signals from the voltage measurement circuit 80 are stabilized at block 308. In one example, this is done with stabilizer circuit 221. The stabilizer circuit 221 includes capacitor 148 that is in series with resistor 146. During a transmit time frame, the output of the voltage measurement circuit 80 (i.e., the current equivalent voltage signals) is coupled to the stabilizer circuit 221. This causes the capacitor 148 to charge. During a receive time frame, the output of voltage measurement circuit 80 of the TDD voltage measurement circuit 117 is disconnected from the stabilizer circuit 221 of the TDD voltage measurement circuit 117 which allows the capacitor 148 to discharge. As discussed above, with a discharge time constant of the capacitor 148 being much slower than the TDD switching signal, the current equivalent voltage signal from the TDD voltage measurement circuit 117 remains stable during the receive time frames.

In one example, stabilizer circuit 221 may be used to filter the current equivalent voltage signal at block 309. In this example, values of the capacitor 148 and resistors 146 (R1), 152 (R2), and 150 (R3) are selected to provide filtering of the current equivalent voltage signal. The filtering may occur when the TDD power amplifier 115 is no longer being switched on and off by the TDD switching signal or the TDD power amplifier 115 is being used in a static transmission mode.

The current equivalent voltage signals are then converted to digital current equivalent voltage signals at block 310. This may be done with the ADC 136 which may be part of the TDD voltage measurement circuit 117 or a component that is coupled to an output of the TDD voltage measurement circuit 117. The digital current equivalent voltage signals are then coupled to bus 135 in block 312. Examples of a digital bus that may be used in the communication system 100 is a IIC bus or a SPI bus.

At block 314, the digital current equivalent voltage signals are read. This is done by a controller 143 that is used, in an example, to control operations of the communications of the communication systems. Controller 143 may be an FPGA, processor, microprocessor or formed in the cloud. Controller 143 determines the current associated with the digital current equivalent voltage signals at block 316. The determined current is used in the operation and the calibration of the communication system 100 at block 318. The process continues at block 302 generating TDD switching signals.

EXAMPLE EMBODIMENTS

Example 1 includes a current monitoring circuit for a TDD power amplifier in a communication system, the current monitoring circuit includes a voltage measurement circuit and a stabilizer circuit. The voltage measurement circuit is configured to generate current equivalent voltage output signals from a voltage drop of a sense resistor in a DC supply line coupled with the TDD power amplifier. The stabilizer circuit has an output that is coupled to an analog-to-digital converter. The stabilizer circuit includes a switch, a first resistor, a capacitor and a first voltage supply. The switch includes a first post that is coupled to an output of the voltage measurement circuit. The first resistor has a first side coupled to a second post of the switch. The capacitor coupled in series with the first resistor. The capacitor is further coupled to ground. The first voltage supply is coupled to control the switch based on operations of a TDD power amplifier.

Example 2 includes the current monitoring circuit of Example 1, wherein the switch is synchronized with the first voltage supply by a TDD switching signal used to switch radio frequency (RF) transistors in the TDD power amplifier.

Example 3 includes the current monitoring circuit of any of the Examples 1-2, further wherein the stabilizer circuit further includes a second resistor, a third resistor, a second operational amplifier, and a third operational amplifier. The second resistor has a first side the is coupled to the second post of the switch and a second side that is coupled to the ground. The third resistor has a first side that is coupled to the second post of the switch. The second operational amplifier has a first input that is coupled to receive the current equivalent voltage signals output from the voltage measurement circuit. The second operational amplifier has a second input that is coupled to the output of the second operational amplifier. The output of the second operational amplifier is coupled to the first post of the switch. The third operational amplifier has a first input that is coupled to a second side of the third resistor. The third operational amplifier has a second input that is coupled to an output of the third operation amplifier. The output of the third operational amplifier is coupled to the analog-to-digital converter.

Example 4 includes the current monitoring circuit of Example 3, wherein the stabilizer circuit includes a fifth resistor that is coupled between the output of the third operational amplifier and the ground.

Example 5 includes the current monitoring circuit of Example 3, wherein the voltage measurement circuit further includes a sense resistor, a second voltage supply and a first operational amplifier. The sense resistor has a first side that is coupled to the TDD power amplifier. The second voltage supply couples a reference voltage to a second side of the sense resistor. The first operational amplifier has a first input that is coupled to the first side of the sense resistor and a second input that is coupled to the second side of the sense resistor. An output of the first operational amplifier is coupled to the first input of the second operational amplifier of the stabilizer circuit.

Example 6 includes the current monitoring circuit of Example 5, wherein the sense resistor is a shunt resistor.

Example 7 includes the current monitoring circuit of Example 5, wherein at least one of the first operational amplifier, second operational amplifier and third operational amplifier is a discrete operational amplifier.

Example 8 includes the current monitoring circuit of Example 5, wherein at least one of the first operational amplifier, second operational amplifier and third operational amplifier is a sample and hold operational amplifier.

Example 9 includes a current monitoring circuit for a TDD power amplifier in a communication system. The current monitoring circuit includes a voltage measurement circuit and a stabilizer circuit. The stabilizer circuit includes a switch, a first resistor, a capacitor, a first voltage supply, a second resistor, a third resistor, a second operational amplifier, and a third operational amplifier. The voltage measurement circuit is configured to generate current equivalent voltage output signals. The switch of the stabilizer circuit includes a first post that is coupled to an output of the voltage measurement circuit. The first resistor has a first side that is coupled to a second post of the switch. The capacitor is coupled in series with the first resistor. The capacitor is further coupled to ground. The first voltage supply is coupled to control the switch synchronized with the first voltage supply by a TDD switching signal used to switch RF transistors in the TDD power amplifier. The second resistor has a first side that is coupled to the second post of the switch and a second side that is coupled to the ground. The third resistor has a first side that is coupled to the second post of the switch. The second operational amplifier has a first input that is coupled to receive the current equivalent voltage signals output from the voltage measurement circuit. The second operational amplifier has a second input that is coupled to the output of the second operational amplifier. The output of the second operational amplifier is coupled to the first post of the switch. The third operational amplifier has a first input that is coupled to a second side of the third resistor. The third operational amplifier has a second input that is coupled to an output of the third operation amplifier. The output of the third operational amplifier coupled to an ADC.

Example 10 includes the current monitoring circuit of Example 9, wherein the stabilizer circuit further includes a fifth resistor coupled between the output of the third operational amplifier and the ground.

Example 11 includes the current monitoring circuit of any of the Example 9-10, wherein the voltage measurement circuit further includes a sense resistor, a second voltage supply and first operational amplifier. The sense resistor is in a direct current (DC) supply line and has first side coupled to the TDD power amplifier. The second voltage supply couples a reference voltage to a second side of the sense resistor. The first operational amplifier has a first input that is coupled to the first side of the sense resistor and a second input that is coupled to the second side of the sense resistor. An output of the first operational amplifier is coupled to the first input of the second operational amplifier of the stabilizer circuit.

Example 12 includes the current monitoring circuit of Example 11, wherein the sense resistor is a shunt resistor.

Example 13 includes the current monitoring circuit of any of the Examples 11-12, wherein at least one of the first operational amplifier, second operational amplifier and third operational amplifier is a discrete operational amplifier.

Example 14 includes the current monitoring circuit of and of the Examples 11-12, wherein at least one of the first operational amplifier, second operational amplifier and third operational amplifier is a sample and hold operational amplifier.

Example 15 includes the current monitoring circuit of any of the Examples 11-14, wherein the ADC is further coupled to a bus.

Example 16 includes the current monitoring circuit of Example 15, wherein the bus is one of a serial peripheral interface bus and an inter-integrated circuit bus.

Example 17 includes a method of operating a communication system. The method includes generating TDD switching signals having transmit time frames and receive time frames; controlling RF transistors in a TDD power amplifier based on the TDD switching signals, wherein the TDD switching signals selectively turn on and off the RF transistors based on the transmit time frames and receive time frames; generating current equivalent voltage output signals from a voltage drop of a sense resistor in a direct current (DC) supply line coupled to the TDD power amplifier with a voltage measurement circuit; stabilizing the equivalent voltage output signal by selectively applying a stabilizer circuit that includes a capacitor in series with a resistor during a transmit frame in the TDD switching signals and disconnecting the stabilizer circuit during a receive frame of the TDD switching signals; converting the equivalent voltage output signal to a digital signal equivalent voltage output signal; reading the digital signal current equivalent voltage output signal off of a bus; and determining a current of the TDD power amplifier from the digital signal current equivalent voltage read off of the bus.

Example 18 includes the method of Example 17, further including using the current of the TDD power amplifier in operating the communication system.

Example 19 includes the method of any of the Examples 17-18, wherein operating the communication system further includes compensating for TDD power amplifier.

Example 20 includes the method of any of the Examples 17-19, further including filtering the equivalent voltage output signal with the stabilizing circuit.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

The invention claimed is:

1. A current monitoring circuit for a time division duplex (TDD) power amplifier in a communication system, the current monitoring circuit comprising:

a voltage measurement circuit configured to generate current equivalent voltage output signals from a voltage drop of a sense resistor in a direct current (DC) supply line coupled with the TDD power amplifier; and a stabilizer circuit, an output of the stabilizer circuit coupled to an analog-to-digital converter (ADC), the stabilizer circuit including, a switch including a first post coupled to an output of the voltage measurement circuit;

a first resistor having a first side coupled to a second post of the switch:

a capacitor coupled in series with the resistor, the capacitor further coupled to ground; and a first voltage supply coupled to control the switch based on operations of a TDD power amplifier.

2. The current monitoring circuit of claim 1, wherein the switch is synchronized with the first voltage supply by a TDD switching signal used to switch radio frequency (RF) transistors in the TDD power amplifier.

3. The current monitoring circuit of claim 1, further wherein the stabilizer circuit further comprises:

a second resistor having a first side coupled to the second post of the switch and a second side coupled to the ground;

a third resistor having a first side coupled to the second post of the switch;

a second operational amplifier having a first input coupled to receive the current equivalent voltage signals output from the voltage measurement circuit, the second operational amplifier having a second input coupled the output of the second operational amplifier, the output of the second operational amplifier coupled to the first post of the switch; and a third operational amplifier having a first input coupled to a second side of the third resistor, the third operational amplifier having a second input coupled to an output of the third operation amplifier, the output of the third operational amplifier coupled to the ADC.

4. The current monitoring circuit of claim 3, wherein the stabilizer circuit further comprises:

a fifth resistor coupled between the output of the third operational amplifier and the ground.

5. The current monitoring circuit of claim 3, wherein the voltage measurement circuit further comprises:

the sense resistor having first side coupled to the TDD power amplifier;

a second voltage supply coupling a reference voltage to a second side of the sense resistor; and a first operational amplifier having a first input coupled to the first side of the sense resistor and second input coupled to the second side of the sense resistor, an output of the first operational amplifier coupled to the first input of the second operational amplifier of the stabilizer circuit.

6. The current monitoring circuit of claim 5, wherein the sense resistor is a shunt resistor.

7. The current monitoring circuit of claim 5, wherein at least one of the first operational amplifier, second operational amplifier and third operational amplifier is a discrete operational amplifier.

8. The current monitoring circuit of claim 5, wherein at least one of the first operational amplifier, second operational amplifier and third operational amplifier is a sample and hold operational amplifier.

9. A current monitoring circuit for a time division duplex (TDD) power amplifier in a communication system, the current monitoring circuit comprising:

a voltage measurement circuit configured to generate current equivalent voltage output signals; and a stabilizer circuit including, a switch including a first post coupled to an output of the voltage measurement circuit;

a first resistor having a first side coupled to a second post of the switch:

a capacitor coupled in series with the first resistor, the capacitor further coupled to ground;

a first voltage supply coupled to control the switch synchronized with the first voltage supply by a TDD switching signal used to switch radio frequency (RF) transistors in the TDD power amplifier;

a second resistor having a first side coupled to the second post of the switch and a second side coupled to the ground;

a third resistor having a first side coupled to the second post of the switch;

a second operational amplifier having a first input coupled to receive the current equivalent voltage signals output from the voltage measurement circuit, the second operational amplifier having a second input coupled the output of the second operational amplifier, the output of the second operational amplifier coupled to the first post of the switch; and a third operational amplifier having a first input coupled to a second side of the third resistor, the third operational amplifier having a second input coupled to an output of the third operation amplifier, the output of the third operational amplifier coupled to an analog-to-digital converter (ADC).

10. The current monitoring circuit of claim 9, wherein the stabilizer circuit further comprises:

a fifth resistor coupled between the output of the third operational amplifier and the ground.

11. The current monitoring circuit of claim 9, wherein the voltage measurement circuit further comprises:

a sense resistor in a direct current (DC) supply line having first side coupled to the TDD power amplifier;

a second voltage supply coupling a reference voltage to a second side of the sense resistor; and a first operational amplifier having a first input coupled to the first side of the sense resistor and second input coupled to the second side of the sense resistor, an output of the first operational amplifier coupled to the first input of the second operational amplifier of the stabilizer circuit.

12. The current monitoring circuit of claim 11, wherein the sense resistor is a shunt resistor.

13. The current monitoring circuit of claim 11, wherein at least one of the first operational amplifier, second operational amplifier and third operational amplifier is a discrete operational amplifier.

14. The current monitoring circuit of claim 11, wherein at least one of the first operational amplifier, second operational amplifier and third operational amplifier is a sample and hold operational amplifier.

15. The current monitoring circuit of claim 11, wherein the ADC is further coupled to a bus.

16. The current monitoring circuit of claim 15, wherein the bus is one of a serial peripheral interface bus and an inter-integrated circuit bus.

17. A method of operating a communication system, the method comprising:

generating TDD switching signals having transmit time frames and receive time frames;

controlling radio frequency (RF) transistors in a TDD power amplifier based on the TDD switching signals, wherein the TDD switching signals selectively turn on and off the RF transistors based on the transmit time frames and receive time frames;

generating current equivalent voltage output signals from a voltage drop of a sense resistor in a direct current (DC) supply line coupled to the TDD power amplifier with a voltage measurement circuit;

stabilizing the equivalent voltage output signal by selectively applying a stabilizer circuit that includes a capacitor in series with a resistor during a transmit frame in the TDD switching signals and disconnecting the stabilizer circuit during a receive frame of the TDD switching signals;

converting the equivalent voltage output signal to a digital signal equivalent voltage output signal;

reading the digital signal current equivalent voltage output signal off of a bus; and determining a current of the TDD power amplifier from the digital signal current equivalent voltage read off of the bus.

18. The method of claim 17, further comprising:

using the current of the TDD power amplifier in operating the communication system.

19. The method of claim 18, wherein operating the communication system further comprises:

compensating for TDD power amplifier.

20. The method of claim 17, further comprising:

filtering the equivalent voltage output signal with the stabilizing circuit.

* * * * *